United States Patent
Huang et al.

(12)

(10) Patent No.: US 6,827,982 B1
(45) Date of Patent: Dec. 7, 2004

(54) BINDER-ENRICHED SILICALITE ADHESION LAYER AND APPARATUS FOR FABRICATING THE SAME

(75) Inventors: Judy Huang, Los Gatos, CA (US); Justin F. Gaynor, San Jose, CA (US); Archita Sengupta, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/137,209

(22) Filed: Apr. 30, 2002

(51) Int. Cl.[7] .................................................. B05D 3/02
(52) U.S. Cl. ........................ 427/387; 524/747; 524/858; 524/859
(58) Field of Search ........................... 427/387; 524/847, 524/858, 859

(56) References Cited

U.S. PATENT DOCUMENTS 6,329,062 B1 * 12/2001 Gaynor ........................ 428/447

* cited by examiner

*Primary Examiner*—Kuo-Liang Peng
(74) *Attorney, Agent, or Firm*—Silicon Valley Patent Group, LLP

(57) ABSTRACT

The adhesion of overlying layers to a silicalite-plus-binder dielectric layer is enhanced by forming a layer that includes the binder in a higher concentration. The overlying layer, e.g., silicon dioxide, silicon carbide or silicon nitride, adheres more tightly to the higher-concentration binder layer. Although the presence of the higher-concentration binder layer may increase the dielectric constant of the overall silicalite-plus-binder stack, the increase is generally minimal.

41 Claims, 7 Drawing Sheets

Table 1(a)

| Wafer | Low K Layer | Thickness of Low K Layer (Å) (UV 1250) | K of Low K Layer | Enriched Binder Layer (Silicalite/Binder Ratio) | Thickness of Enriched Binder Layer (Å) (UV 1250) | K of Enriched Binder Layer | Thickness of Oxide Cap (Å) | Final Stack |
|---|---|---|---|---|---|---|---|---|
| A | yes | 8,151 | 2.20 | No binder | N/A | N/A | 1,000 | Silicalite Low-K/ PETEOS Oxide |
| B | yes | 8,089 | 2.26 | 3 ml/4 drops | 506.15 | 2.64 | 1,000 | Silicalite Low-K/ Silicalite High-K/ PETEOS Oxide |
| C | yes | 8,258 | 2.27 | 3 ml/2 drops | 511.33 | 2.50 | 1,000 | Silicalite Low-K/ Silicalite High-K/ PETEOS Oxide |
| D | yes | 8,071 | 2.30 | 3 ml/1 drop | 431.23 | Not measured | 1,000 | Silicalite Low-K/ Silicalite High-K/ PETEOS Oxide |

Table 1(b)

| Wafer | K of Total Stack (Low-K and High-K Film) No High-K film | Stud Pull Strength (kPSI) | Tape Test |
|---|---|---|---|
| A | 2.324 | Insignificant | Fail |
| B | 2.330 | 11.30 | Pass |
| C | 2.330 | 11.30 | Pass |
| D | 2.300 | 10.56 | Pass |

Fig. 4

Table 2

| Wafer | Low K Layer | Thickness of Low K Layer (Å) (UV 1250) | K of Low K Layer | Enriched Binder Layer (Silicalite/Binder Ratio) | Thickness of Oxide Cap (Å) | Final Stack | MELT Toughness (MPA*m^0.5) |
|---|---|---|---|---|---|---|---|
| E | yes | 7,900 | 2.20 | No binder | 1,000 | Silicalite Low-K/ PETEOS Oxide | Insignificant |
| F | yes | 7,900 | 2.26 | 3 ml/4 drops | 1,000 | Silicalite Low-K/ Silicalite High-K/ PETEOS Oxide | 0.4375 |
| G | yes | 7,900 | 2.27 | 3 ml/6 drops | 1,000 | Silicalite Low-K/ Silicalite High-K/ PETEOS Oxide | 0.4060 |
| H | yes | 7,900 | 2.30 | 3 ml/8 drop | 1,000 | Silicalite Low-K/ Silicalite High-K/ PETEOS Oxide | 0.4025 |

Fig. 5

Table 3

| Binder | Concentration (Moles x $10^6$) | K of Lower Layer Alone | K of Stack After Upper Layer Added | Stud Pull Strength (kPSI) | Tape Test |
|---|---|---|---|---|---|
| OPD-POSS | 2.25 | 1.94 | 2.01 | 6.14 | Passed |
| OPD-POSS | 4.50 | 2.01 | 2.02 | 11.48 | Passed |
| OPD-POSS | 5.70 | 2.03 | 2.04 | 12.00 | Passed |
| OPD-POSS/ TDS/POSS | 5.11 | 2.10 | 2.03 | 11.02 | Passed |

Table 4

| Binder | Binder Length | K of Low-K Layer | K (Total Stack) | Porosity | Modulus/Hardness | Tape Test |
|---|---|---|---|---|---|---|
| Prehydrolized TEOS | 5 Å | 2.27 | 2.32 | 40-45% | 3.5/0.25-0.30 | Pass |
| OPD-POSS | 160 Å | 2.00 | 2.02 | 50-55% | 4.0/0.24 | Pass |

Fig. 6

Table 5

| Binder | K of ULK Layer | Tape Test | Top Layer (Oxide) Adhesion Test (kPSI) | Bottom Layer (ULK) Adhesion Test (kPSI) |
|---|---|---|---|---|
| OPD | 2.00 | Pass | 12 | 12 |
| OPD | 2.05 | Pass | 12 | 11.5 |
| TDS | 2.07 | Pass | 11 | 11 |

Fig. 7

BINDER-ENRICHED SILICALITE ADHESION LAYER AND APPARATUS FOR FABRICATING THE SAME

RELATED APPLICATIONS

The present application is related to the commonly assigned U.S. Pat. No. 6,329,062, issued Dec. 11, 2001, entitled "Dielectric Layer Including Silicalite Crystals and Binder and Method for Producing Same for Microelectronic Circuits" filed Feb. 2, 2000, and application Ser. No. 09/953,547, entitled "Interparticle Binders for Producing Low Dielectric Constant Materials" filed Sep. 14, 2001, each of which is incorporated herein by reference in its entirety.

BACKGROUND

1. Field

The present invention relates generally to the fabrication of semiconductor devices and, more specifically, to improving adhesion between low dielectric constant films and chemical vapor deposition (CVD) films (for example, films made of silicon dioxide, silicon carbide or silicon nitride) that are deposited on top of the low dielectric constant films.

2. Description of the Related Art

Fabrication of integrated circuits (ICs) to improve performance and reduce costs involves a complex analysis of materials properties, processing technology and IC design. ICs consist of multiple layers of conducting, insulating and semiconducting materials, interconnected in various ways by conducting channels and plugs, including various dopants implanted into the IC for producing the desired electronic functionality. Insulating or dielectric layers are used to provide electrical isolation for current-carrying elements of the IC. Such layers are typically referred to as "interlayer dielectrics" or ILDs.

The near-universal trend in the manufacture of integrated circuits is to increase the density of components fabricated onto a given area of wafer, increase the performance and reliability of the ICs, and to manufacture the ICs at lower cost with less waste and fewer defective products generated during the manufacturing process. Increasing component density involves reducing the minimum feature size of the IC including decreasing the spacing between conductors. However, as the spacing between conductors decreases, the possibility of crosstalk and capacitive coupling between conductors increases. Thus, there is a need to decrease the dielectric constant (K) of the insulating material between conductors of the IC, thereby reducing capacitive coupling and crosstalk.

Typical dielectric materials used in present ICs include silicon dioxide, silicon nitride, and cured silsequioxanes. Silicon dioxide has been a popular dielectric since, among other properties, it possesses mechanical and thermal properties to withstand typical semiconductor manufacturing processing steps. However, the dielectric constants of these materials range from approximately 3.0 to approximately 7.0 (or higher) which is not adequate for the performance of future ICs. The speed of operation of future ICs is likely to be limited by RC (resistance-capacitance) delay in the conducting interconnects. Thus, it is desirable to employ a material for the ILDs having low dielectric constants (low-K) thereby permitting a higher density of components to be fabricated on the IC without detrimental electrical effects.

Thin films are typically deposited on the IC by chemical vapor deposition (CVD) or spin-on, which are two widely used processes in the semiconductor industry. In one common scheme, a low-K film is deposited by spin-on deposition, followed by deposition of a CVD cap layer. One drawback of low-K ILD films is the poor adhesion between the low-K films and CVD layers deposited onto the low-K films. Known methods to improve the adhesion characteristics involve some type of in situ plasma pretreatment to chemically modify the surface of the low-K dielectric. For example, ammonia, hydrogen, and nitrogen plasmas will all act as reducing agents that have proven beneficial for some films. An oxygen plasma will strip hydrocarbon impurities from the surface, and this has also proven somewhat beneficial.

There remains a need to compensate for the inadequate adhesion qualities of low-K films. There is a further need to improve the adhesion characteristics of the low-K film without significantly increasing the overall K of the resulting film.

SUMMARY

The present disclosure is directed to apparatus and corresponding methods for improving adhesion between silicalite-plus-binder dielectric films (herein after referred to as "silicalite films") and CVD films deposited on top of the silicalite films. The silicalite film is modified to enhance the adhesion of films subsequently deposited over the silicalite film by depositing a layer of silicalite having an enriched concentration of binder above the standard silicalite film. The additional layer of silicalite having the enriched concentration of binder greatly improves the adhesion characteristics of the total "stack" of the standard silicalite film and the binder-enriched film without significantly increasing the overall K of the total stack.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein.

In one embodiment, a method of treating a low dielectric constant film fabricated on a substrate includes: delivering a first precursor onto a substrate, the first precursor including a binder solution in an organosol having silicalite particles, the concentration of binder solution in the organosol being equal to a first concentration; baking and subsequently curing the substrate to create a low dielectric constant film from the first precursor; delivering a second precursor onto the first precursor, the second precursor including a binder solution in an organosol having silicalite particles, the concentration of binder solution to organosol in the second precursor being a second concentration that is higher than the first concentration; and baking and subsequently curing the substrate to create a binder-enriched film on top of the low dielectric constant film.

In another embodiment, a method of enhancing adhesion to silicalite-plus-binder films on a substrate includes: spin-coating a standard precursor onto a substrate; spin-coating an enriched precursor on top of the standard precursor on the substrate, the enriched precursor having a higher concentration of binder than the standard precursor; and baking and subsequently curing the substrate to create a film on the substrate, where the film is created by the standard precursor and the enriched precursor.

In still another embodiment, a spin-coater for treating a low dielectric constant film fabricated on a substrate includes a coater, a first and second container, and a dispense arm. The coater is operable to support a substrate, and also operable to rotationally spin the substrate. The first and second containers are operable to hold solutions that are to be dispensed on the substrate. The dispense arm is coupled to the first and second containers, and the dispense arm is operable to dispense the solutions contained in the first and second containers onto the substrate. A single dispense arm can contain a multiplicity of supply lines and nozzles. It is generally preferable to segregate two different materials on a spin coater, and so each container will be attached to a dedicated supply line and nozzle. In one version, both containers contain a solution of silicalite particles and a binder, but the concentration of binder in the solution in the second container is higher than the concentration of binder in the solution in the first container. In another version, the first container contains a silicalite solution and the second container contains a binder.

These and other embodiments of the present invention will also become readily apparent to those skilled in the art from the following detailed description of the embodiments having reference to the attached figures, the invention not being limited to any particular embodiment(s) disclosed.

BRIEF DESCRIPTION OF THE DRAWINGS

FIG. 4 contains Tables 1(a) and 1(b), which summarize the results of Experiment 1.

FIG. 5 contains Table 2, which summarizes the results of Experiment 2.

FIG. 6 contains Tables 3 and 4, which summarize some of the results of Experiment 3.

FIG. 7 contains Table 5, which summarizes some of the results of Experiment 3.

DETAILED DESCRIPTION

Figure 1:
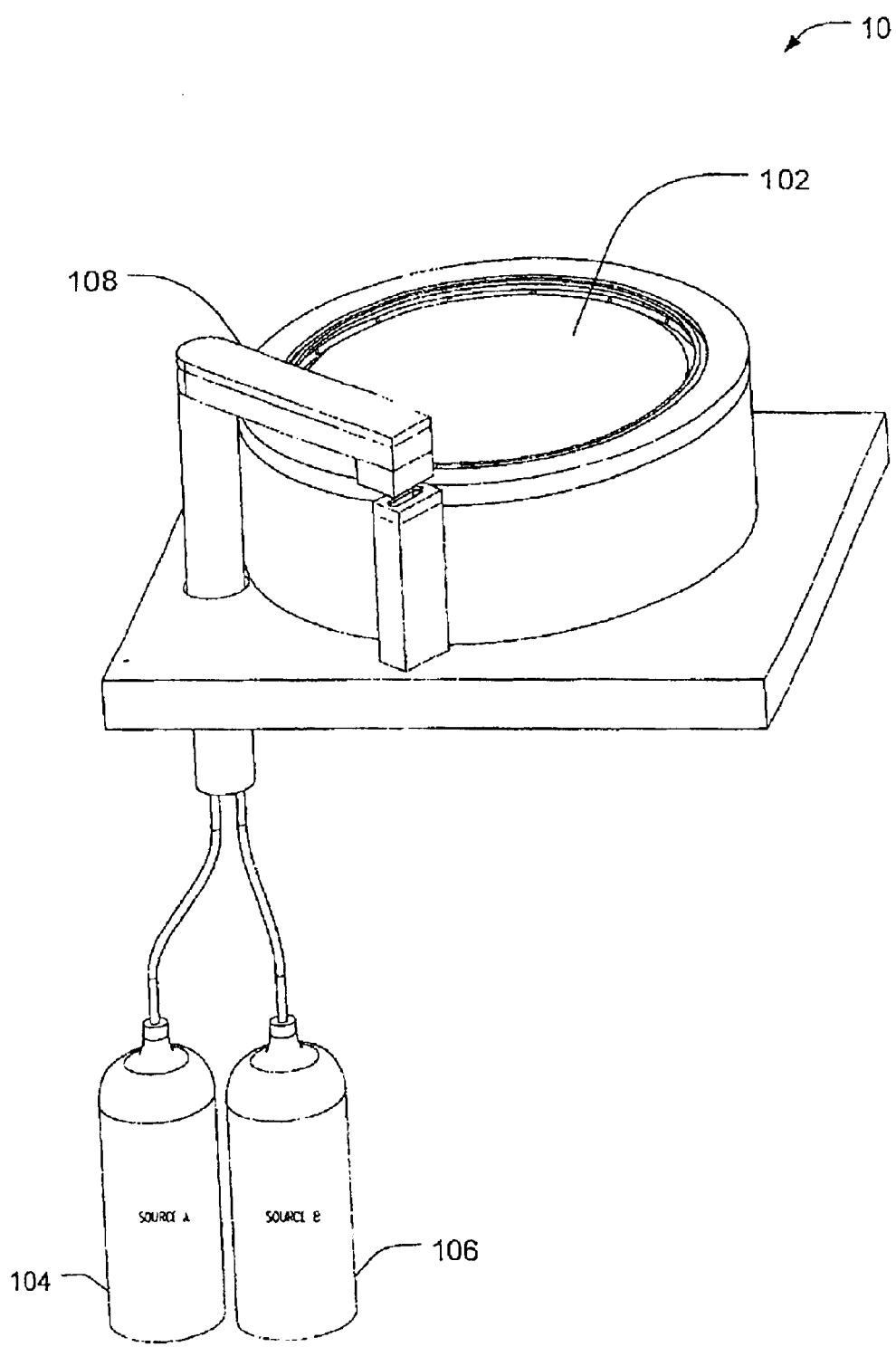
FIG. 1 illustrates a spin-coater having dual source dispense capability, according to one embodiment.

The present invention relates to a surface treatment of silicalite films to enhance the adhesion of subsequent layers deposited on the films. The treatment involves a deposition of a layer of silicalite having an enriched concentration of binder above the standard silicalite film on, for example, a substrate such as a silicon wafer.

Silicalites are microporous crystalline oxides of silicon that are pure-silicon analogs of zeolites. The silicalite/binder porous material uses silicalite nanoparticles or nanocrystals that are smaller than the characteristic dimensions of the features on the IC device. The individual silicalite particles or crystals should be no larger than about 20% of the critical dimension of the smallest feature on the chip and a statistically insignificant number of the particles should have a long axis greater than about 40% of the critical dimension. One example of a silicalite is SilicaLite™, which is available from Novellus Systems, Inc. of San Jose, Calif.

Dielectric films are commonly used in the fabrication of ICs. Silicalite nanoparticles provide building blocks for strong, crystalline $SiO_2$-based porous matrices that result in films having desirable thermal and mechanical properties when held together in the porous skeleton by suitable binders. As used herein, "silicalite nanoparticles" or "silicalite nanocrystals" refer to the structural components to be held together by binder material to form a porous dielectric, recognizing that this is illustrative and not limiting. Silicalite crystals suitable for use as ILDs are described, for example, in the above-referenced U.S. Pat. No. 6,329,062.

The binder is a material that links or "glues" the silicalite nanoparticles together while creating porosity between the silicalite nanoparticles to form the porous dielectric material. The binder can be formed from a binder precursor material, which, on heating, polymerizes or crosslinks with itself or with any terminal hydroxyl or other surface groups on the silicalite crystals to form an amorphous material that holds the silicalite crystals together. Examples of binder precursors include, without limitation, tetraethyl orthosilicate (TEOS), prehydrolyzed TEOS, derivatives of polyhedral oligomeric silsesquioxanes (POSS), tetramethoxysilane (TMOS), methylsilsesquioxane, hydridosilsesquioxane, and organic polymers such as poly(arylene ethers) and benzocyclobutenes. The binder material may also be a porous amorphous silica. The silicalite/binder porous material can have a dielectric constant less than about 2.6 and a porosity of about 50% or higher.

Porous dielectric materials (e.g., dielectric films) can be formed by binding together numerous small particles into a skeletal matrix. Suitable binders for forming porous dielectric materials are described, for example, in the above-referenced application Ser. No. 09/953,547.

The aforementioned two-component porous oxide material having small silicalite nanoparticles in a binder material provides a low-K material that may be used as an insulating layer in microelectronic devices. The silicalite nanoparticles are supplied as a colloidal silicalite suspension in a liquid medium. The silicalite nanoparticles are present in the colloidal silicalite suspension at a concentration of from about 3% to about 8% by weight, a typical silicalite concentration being about 5 weight %. In one approach, the appropriate binder precursor is added directly to the colloidal silicalite suspension and the resulting solution is spin-coated onto a semiconductor substrate. The amount of binder precursor in the total solution (i.e., silicalite and binder solution) is limited to between about 0.1%–1% by volume. The binder precursor used in this approach must be stable, that is, minimally chemically reactive at typical storage temperatures, in the colloidal silicalite suspension solution. The binder precursor also needs to be soluble in the same solvent in which the colloidal silicalite suspension is prepared.

The precursor containing silicalite and binder (sometimes referred to herein as a "standard precursor") is fabricated onto a substrate to create a standard low-K film. Subsequently, a binder-enriched precursor (sometimes referred to herein as an "enriched precursor") is fabricated onto the standard low-K film. The enriched precursor is a silicalite/binder solution that is nearly identical to the standard precursor, except that the concentration of binder in the enriched precursor is approximately 2 to 20 times the concentration of binder in the standard precursor. A technical advantage of fabricating the substrate with the enriched precursor is that the enriched precursor provides enhanced adhesion characteristics for the total stack formed from the standard and binder precursors without significantly increasing the K of the total stack.

FIG. 1 illustrates a spin-coater 10 having dual source dispense capability, according to one embodiment. Spin-coater 10 can be used to fabricate a substrate with both a standard precursor and a binder-enriched precursor. As depicted, spin-coater 10 includes a coater 102, containers 104 and 106, and a dispense arm 108. Containers 104 and 106 are coupled to dispense arm 108.

Coater 102 functions to support a substrate such as a silicon wafer. Coater 102 is capable of rotational motion, which is imparted by a suitable mechanism such as a motor (not shown). The wafer rests on coater 102 during the spin-coating process.

Containers 104 and 106 each function as a container that holds a solution that is to be dispensed during the spin-coating process. For example, the standard precursor can be placed in container 104 and the enriched precursor can be placed in container 106. Containers 104 and 106 can be either pressurized containers or pumps connected to containers, such as bottles. Here, the bottles can contain the standard precursor and the enriched precursor, respectively.

Dispense arm 108 functions to dispense the contents provided in containers 104 and 106 onto the substrate positioned on coater 102. As depicted, dispense arm 108 is coupled to each of containers 104 and 106 by respective tubes. A control device, such as a microprocessor (not shown) can sequence the dispensing of the contents provided in containers 104 and 106 through dispense arm 108 onto the surface of the substrate supported on coater 102. The control device can also control the movement of dispense arm 108 and the motor that functions to rotate coater 102.

In another embodiment, container 104 can hold a colloidal silicalite suspension and container 106 can hold a binder solution. For example, the binder precursor may be somewhat reactive in the colloidal silicalite suspension at room temperature. In this embodiment, the control device of spin-coater 10 can mix, for example, utilizing a mixer (not shown), the colloidal silicalite suspension and the binder solution to create either the standard precursor or the enriched precursor immediately prior to dispensing onto a substrate. Thus, the colloidal silicalite suspension and the binder solution having a binder precursor in a solvent miscible with the solvent of the colloidal silicalite suspension can be premixed immediately before spin-coating onto the substrate.

In still another embodiment, the colloidal silicalite suspension and the binder solution are dispensed onto a substrate in separate applications. For example, spin-coater 10 can dispense the colloidal silicalite suspension and the binder solution in a ratio appropriate for the standard precursor. Subsequently, spin-coater 10 can then dispense the colloidal silicalite suspension and the binder solution in a ratio appropriate for the enriched precursor. This approach is useful if the binder is highly reactive towards the colloidal silicalite suspension and, therefore, has an impracticably short shelf life, or if the binder is to be introduced by gaseous infiltration rather than as a liquid. Any thermally activated precursor can be used in the binder solution in this embodiment.

Figure 2:
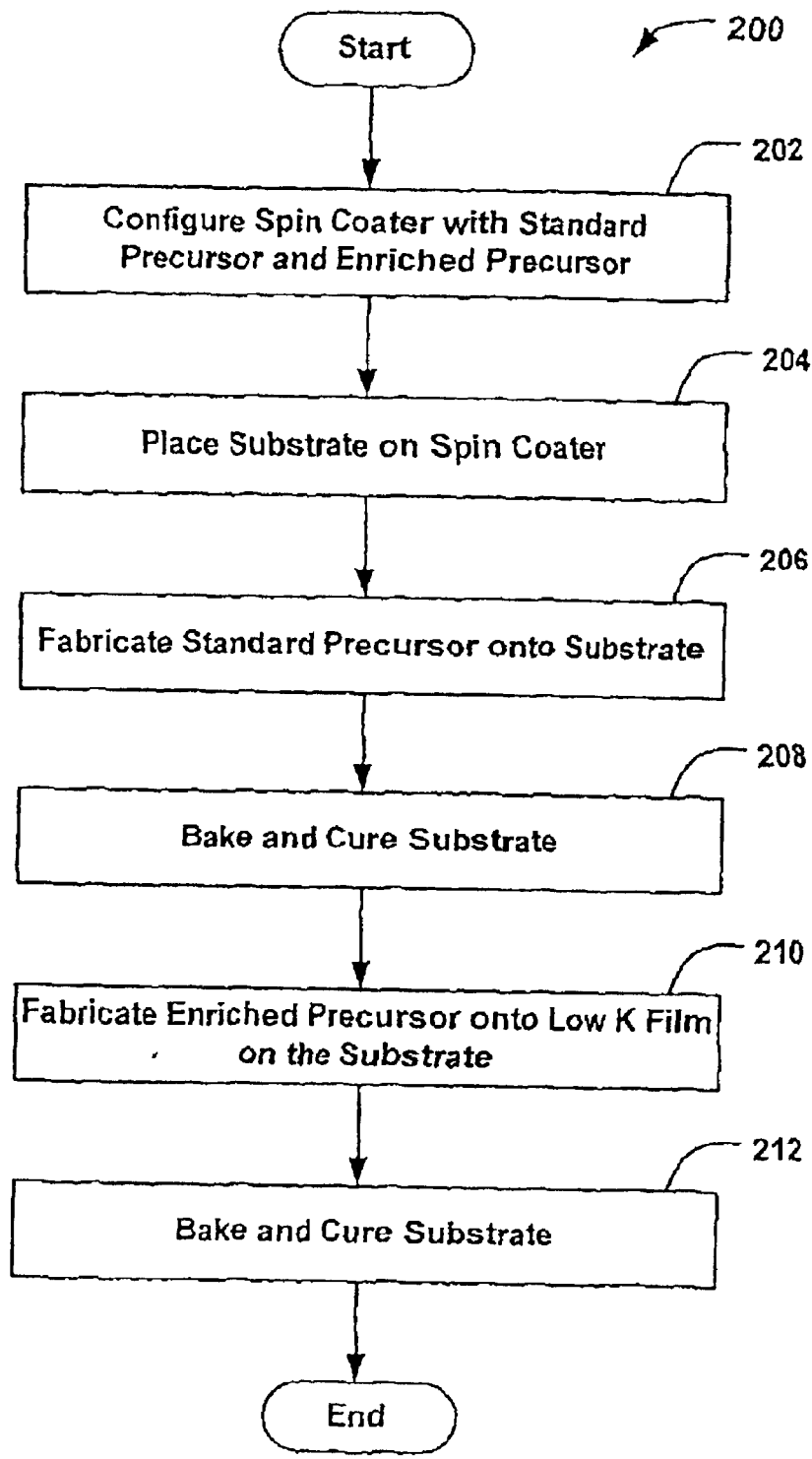
FIG. 2 is a flow chart of an exemplary process for depositing a layer of silicalite having an enriched concentration of binder on a silicalite film.

FIG. 2 is a flow chart of an exemplary process 200 for depositing a layer of silicalite having an enriched concentration of binder on a silicalite film formed from a standard precursor. Beginning at a start step, a binder solution and a silicalite solution are selected. As described in the example below, the process has been demonstrated with prehydrolyzed TEOS as the binder and a colloidal silicalite suspension as the silicalite solution. The binder and colloidal silicalite suspension were mixed in appropriate quantities to create a standard precursor and an enriched precursor.

At step 202, the standard precursor is placed in one of the containers (e.g., container 104) and the enriched precursor is placed in the other container (e.g., container 106). At step 204, a substrate, such as a silicon wafer, is positioned on coater 102. At step 206, the standard precursor is delivered onto the substrate to create a low-K film on the surface of the substrate. The standard precursor solution can be spin-coated onto the substrate using industry standard methods. In particular, the standard precursor is dispensed onto the substrate and the substrate subsequently spun to spincoat the low-K film on the substrate.

Following the spin-coating, at step 208 the silicalite film is dried in order to form the interparticle binding of the silicalite film. The substrate is soft baked at temperatures in the range of approximately 200° C. to 250° C. for up to approximately 20 minutes or for a duration sufficient to remove the solvent. The substrate is then subjected to between a few minutes and a few hours of high temperature cure at temperatures in the range of approximately 300° C. to 500° C. to produce a stable film. Following curing, the silicalite film may be passivated by exposing it to a silylating agent such as hexamethyldisilazane (HMDS), for example, for 10 minutes at room temperature or for 1 minute at 200° C.

At step 210, the substrate having the low-K film is positioned on coater 102 and the enriched precursor is delivered onto the low-K film to create a binder-enriched silicalite layer or film on top of the existing low-K film. The enriched precursor solution can also be spin-coated onto the low-K film using industry standard methods. In particular, the enriched precursor is dispensed onto the low-K film on the substrate and the substrate subsequently spun to spin-coat a binder-enriched silicalite film on top of the low-K film currently on the substrate. At step 212, the binder-enriched silicalite film is dried by soft baking the substrate at temperatures in the range of approximately 200° C. to 250° C. for up to approximately 20 minutes or for a duration sufficient to remove the solvent and by curing the substrate for approximately 3 minutes at temperatures in the range of approximately 300° C. and 500° C. Following curing, the binder-enriched silicalite film may be passivated as described above.

Figure 3:
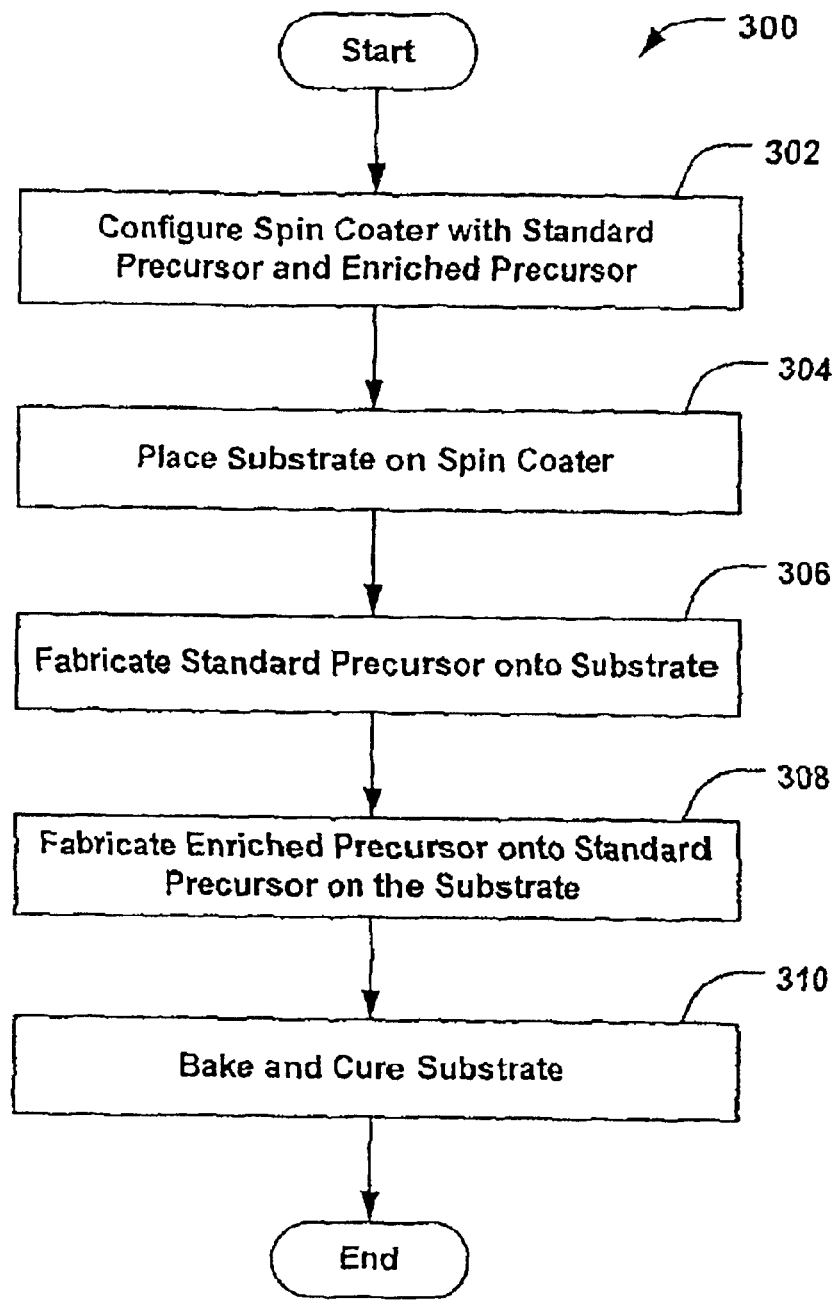
FIG. 3 is a flow chart of another exemplary process for depositing a layer of silicalite having an enriched concentration of binder on a silicalite film.

FIG. 3 is a flow chart of an alternative process 300 for depositing a layer of silicalite having an enriched concentration of binder on a silicalite film, wherein the standard and enriched precursors are cured in a single step.

Steps 302, 304, and 306 in process 300 are identical to steps 202, 204, and 206 in process 200, respectively. Following the spin-coating of the standard silicalite film on the substrate at step 306, the standard silicalite film is soft-baked at 200° C. for 5 minutes. At step 308, the enriched precursor is then dispensed onto the standard precursor and the substrate is subsequently spun to create a binder-enriched silicalite film on top of the standard silicalite film. The standard and enriched precursors can be spin-coated using industry standard methods. At step 310, the silicalite film and the binder-enriched silicalite film are dried by soft-baking the substrate at temperatures in the range of approximately 200° C. to 250° C. for up to approximately 20 minutes or for a duration sufficient to remove the solvent and by curing the substrate for a few hours at temperatures in the range of approximately 300° C. to 500° C.

EXPERIMENTS

The following experiments were performed based on a working hypothesis that identical concentrations of silicalite solids in a suspension will yield identical film thicknesses, provided that the films are prepared in an identical manner. Generally, the concentration of silicalite in a suspension is adjusted by dilution or boiling down until a target thickness (and thus, a target concentration) is reached after spinning at 800 rpm. The assumption is that the silicalite particle sizes are the same in all the batches (i.e., precursors). For example, two precursors that both yield a film thickness of 4,800 Å after spinning at 800 rpm are considered to have the same silicalite concentration.

A suspension of 400±20 Å diameter silicalite particles in 1-propanol (referred to herein as "silicalite organosol") was created, with a high enough silicalite concentration to yield films approximately 3,000–4,000 Å thick after being spin-coated at 800 rpm. One method of preparing the silicalite organosol is described in the above-referenced application Ser. No. 09/514,966. To form the standard precursor, a binder solution containing 27% prehydrolyzed TEOS in ethanol ("prehydrolyzed TEOS") was added to the silicalite organosol in the ratio of one drop (0.021 ml) of the binder solution to 6 ml of the silicalite organosol. Prehydrolyzed TEOS is available as Silbond® H-5, produced by Silbond Corporation of Weston, Mich. The measured K value for the standard precursor film (i.e., the film produced by the standard precursor) was no greater than 2.2.

Experiment 1

In Experiment 1, three different enriched precursors were created. The silicalite organosol, described above, which is used to make the standard precursor, was diluted to the point where the organosol solution (hereinafter the "diluted organosol solution"), when spin-coated at 800 rpm, produced a film approximately 1,600–2,000 Å thick (as compared with 3,000–4,000 Å thick for the standard silicalite organosol).

A first enriched precursor was prepared by adding 4 drops (0.083 ml) of the prehydrolyzed TEOS binder to 3 ml of the diluted silicalite organosol solution. A second enriched precursor was then prepared by adding 2 drops (0.042 ml) of the prehydrolyzed TEOS binder to 3 ml of the diluted silicalite organosol solution; and a third enriched precursor was prepared by adding 1 drop (0.021 ml) of the prehydrolyzed TEOS binder to 3 ml of the diluted silicalite organosol solution.

Each of the three enriched precursors was spun onto a silicon substrate at 4,000 rpm to determine the thickness of the film resulting from the combination of enriched precursor and higher spin speed. The thicknesses were measured using a KLA-Tencor model UV1250 ellipsometer and reflectometer. The thickness of the film produced by the first enriched precursor was 506.15 Å and the K value was approximately 2.640. The thickness of the film produced by the second enriched precursor was 511.33 Å and the K value was approximately 2.500. The thickness of the film produced by the third enriched precursor was 431.23 Å and the K value was not measured.

In summary, the standard organosol solution usually generates a film having thickness of 3,000–4,000 Å at 800 rpm. In contrast, the diluted organosol solution generates a film having thickness of 1,600–2,000 Å at 800 rpm. The enriched precursor solution made from this diluted organsol solution generates a film having thickness in the range of 400–500 Å at 4,000 rpm. Thus, the enriched precursor starts with a more dilute silicalite suspension than the standard precursor, but the enriched precursor has a much higher concentration of binder than the standard precursor. As described below, the K values of the enriched precursor alone are higher than the K values of the standard precursor alone.

Four sample wafers (wafers A, B, C, and D) were created with the standard precursor, each utilizing the process of spin-coating, baking and curing silicalite films. The standard precursor created a film (referred to herein as the "low-K film") on each of the sample wafers A, B, C, and D having a thickness of approximately 8,151 Å, 8,089 Å, 8,258 Å, and 8,071 Å, respectively. The K values for the low-K films on the sample wafers A, B, C, and D were 2.200, 2.260, 2.270, and 2.300, respectively.

An enriched precursor film was not deposited on wafer A, which was used as a ail control sample wafer. Each of the other three wafers B, C, and D then had one of the Three enriched precursors deposited directly onto the low-K film. Approximately 3 ml of the first enriched precursor was dispensed onto the low-K film on wafer B. Likewise, approximately 3 ml of the second and third enriched precursors were dispensed onto the low-K films on wafers C and D, respectively. Immediately after dispensing the enriched precursor, each of the sample wafers B, C, and D was accelerated at a nominal acceleration rate of 4000 rpm/sec to 4,000 rpm. After the spin-coating was completed, wafers B, C, and D were subjected to 20 minutes of hotplate bake at 225° C. and 3 minutes of cure at 400° C. Following curing, the silicalite film was passivated by exposing it to hexamethyldisilazane (HMDS) vapor for 10 minutes at room temperature.

The enriched precursor created a film (referred to herein as the "high-K film") on each of the sample wafers B, C, and D having a thickness between approximately 400–500 Å. The measured K values for the total stack of low-K film and high-K film on wafers B, C and D were 2.324, 2.330 and 2.300, respectively. Thus, for each of the sample wafers B, C, and D, the K values for the stack of low-K and high-K films was not significantly higher than the K value for the low-K film alone (2.324 vs. 2.260, 2.330 vs. 2.270, and 2.300 vs. 2.300), and yet, as is shown below, the adhesion strength is significantly increased on wafers B, C, and D.

The sample wafers A, B, C, and D were placed into a parallel-plate Sequel™ plasma-enhanced CVD reactor, available from Novellus Systems, Inc., and an approximately 1,000 Å thick dielectric layer of silicon dioxide was deposited by a plasma-enhanced CVD process, using TEOS.

Wafers A, B, C, and D were then subjected to an industry-standard stud pull test and a scribed tape test. These tests measure the adhesion characteristics of the films deposited on the wafers.

A stud pull strength measurement of at least 5 kPSI indicates good adhesion characteristics between the silicalite film and the porous oxide film, and the adhesion characteristic improves as the kPSI value increases. An unmeasurably low value was measured when control wafer A was subjected to the stud pull test. In contrast, values of 11.30, 11.30, and 10.56 kPSI were measured for wafers B, C, and D, respectively. Thus, wafer A showed very poor adhesion characteristics between the silicalite film and the oxide film while wafers B, C, and D showed excellent adhesion characteristics between the silicalite film and the oxide film.

Control wafer A failed the tape test while wafers B, C, and D passed the tape test. Thus, the results of Experiment 1 indicate that a fabrication of an enriched binder layer substantially improves the adhesion between the silicalite films and subsequently deposited films (e.g., standard oxide film) without a significant increase in the K of the total stack.

The maximum K value ofjust the enriched precursor film was approximately 2.64 and for wafers B and C the K value averaged 2.57. Therefore, if the K of the total stack of standard precursor film and enriched precursor film equals or exceeds 2.64, there is no advantage to fabricating an enriched precursor film onto the standard precursor film to increase the adhesion characteristics of the standard precursor film because the use of a single enriched precursor film provides the same adhesion characteristics as the two films. Therefore, the K of the total stack can approach 2.64 and still provide a benefit over a single enriched precursor film. One goal is to minimize the capacitance of the total stack, therefore, a lower K value for the total stack (i.e., a K value that is closer to 2.2 (K of the low-K layer)) is beneficial.

The results of Experiment 1 are summarized in Tables 1(a) and 1(b) in FIG. 4.

Experiment 2

In Experiment 2, sample wafers E, F, G, and H were prepared in a similar manner as sample wafers A, B, C, and D, respectively, except that the enriched precursors used in forming the high-K films on sample wafers G, and H contained a different concentration of binder than the enriched precursors used in Experiment 1. Wafers E and F were prepared in the same manner as wafers A and B, respectively.

In Experiment 2, three different enriched precursors were also created. A first enriched precursor was created by adding 4 drops (0.083 ml) of the prehydrolyzed TEOS binder solution to 3 ml of the diluted silicalite organosol solution. (As noted above, the diluted silicalite organosol solution was more dilute than the silicalite organosol solution used to make the standard precursor, and diluted silicalite organosol solution produced a film of approximately 1,600–2,000 Å thickness at 800 rpm.)

A second enriched precursor was created by adding 6 drops (0.125 ml) of the prehydrolyzed TEOS binder solution to 3 ml of the diluted silicalite organosol solution. A third enriched precursor was created by adding 8 drops (0.166 ml) of the prehydrolyzed TEOS binder solution to 3 ml of the diluted silicalite organosol solution.

Low-K films were formed on wafers E, F, G, and H with the standard precursor, each utilizing the processes of spin-coating, baking and curing the low-K films. The low-K film on each of the sample wafers E, F, G, and H had a thickness of approximately 7,900 Å. A high-K film was not formed on wafer E, which was used as the control wafer. Each of wafers F, G, and H had one of the three enriched precursors deposited directly onto the low-K film. Approximately 3 ml of the first, second and third enriched precursors were dispensed onto the low-K films on wafers F, G and H, respectively. Immediately after dispensing the enriched precursor, each of the sample wafers F, G, and H was accelerated to 4,000 rpm at a nominal acceleration rate of 400 rpm/sec. Once the spin-coating was completed, the enriched-precursor-capped sample wafers (wafers F, G, and H) were subjected to 20 minutes of hotplate bake at 225° C. and 3 minutes of cure at 400° C. Following curing, the silicalite film was passivated by exposing it to hexamethyldisilazane (HMDS) vapor for 10 minutes at room temperature.

The measured K value for the stack of low-K and high-K films on wafers F, G, and H were similar to the K value for the stack on wafers B, C, and D in Experiment 1.

The sample wafers A, B, C, and D were placed into a parallel-plate Sequel™ plasma-enhanced CVD reactor, and an approximately 1,000 Å thick dielectric layer of silicon dioxide was deposited by a plasma-enhanced CVD process, using TEOS. Sample wafers E, F, G, and H were then subjected to an industry-standard modified edge liftoff test (MELT). The MELT is a measure of interfacial fracture toughness of the films deposited on the wafers. The interfacial fracture toughness is measure in units of megapascal*meters$^{0.5}$ (MPA*m^0.5).

An insignificant MPA*m^0.5 value was measured when control wafer E was subjected to the modified edge liftoff test. In contrast, MPA*m^0.5 values of 0.4375, 0.406, and 0.4025 were measured for wafers F, G, and H, respectively. It has been reported that a porous polymeric material (SiLK™ available from The Dow Chemical Company) has a MELT toughness of 0.3 MPA*m^0.5 for films with enough porosity to lower the dielectric constant to 2.0. E. Schaffer II, K. E. Howard, M. Mills, and H. Townsend III, "The Mechanical Integrity of Ultra Low Dielectric Constant Materials for Use in ULSI BEOL Structures," Materials Research Society Symposium Proceedings Volume 612, D1.1.1–D1.1.8 (2000). It has also been demonstrated that a SiLK™ film with a dielectric constant of approximately 2.0 (and thus, presumably, a fracture toughness of about 0.3 MPA*m^0.5) can be formed into an integrated circuit device. J. Waeterloos et al., "Integration Feasibility of Porous SiLK™ Semiconductor Dielectric," Proceedings of the IEEE 2001 International Interconnect Technology Conference, 253–4 (2001). Thus, as interpreted by the MPA*m^0.5 measurements in Table 2, each of the wafers F, G, and H displayed a significantly higher fracture toughness than 0.3 MPA*m^0.5, which should be sufficient for integrated circuit manufacture.

The results of Experiment 2 are summarized in Table 2 in FIG. 5.

Experiment 3

In Experiment 3, different binders were used in the standard precursor and the enriched precursor, respectively. The standard precursor solutions contained octapolydimethylsiloxane-POSS ("OPD-POSS") or a mixture of OPD-POSS and trisdimethylsilane cyclopentyl-POSS ("TDS-POSS") as binders, whereas the enriched precursor contained prehydrolyzed TEOS as a binder. The "POSS" binders used in the standard precursor form an ultra-low-K ("ULK") film and are further described in the above-referenced application Ser. No. 09/953,547.

Four standard precursor solutions were prepared from the same silicalite organosol stock solution. Three of the solutions had OPD-POSS as the binder in different concentrations; one solution had a mixture of OPD-POSS and TDS-POSS as the binder. The molar concentrations of the binder in each of the solutions are shown in Table 3, shown in FIG. 6.

The purpose of Experiment 3 was to: 1) to confirm the correlation between the cap layer adhesion and the "POSS" binder concentration, and 2) to determine the adhesion quality of the film with the "POSS" binders.

The standard film deposited on each of these wafers was a ULK film made with a silicalite organosol and an OPD-POSS binder or an OPD-POSS/TDS-POSS mixed binder. The ULK films had a K values in the range of 1.94 to 2.10. The high-K film was formed from the diluted precursor with prehydrolyzed TEOS as the binder. The presence of the high-K film did not increase the K of the stack significantly (within experimental error). The composition of the stack for each of the four wafers was Silicalite-ULK/Silicalite High-K/oxide cap.

Each ULK film was prepared utilizing the spin-coating process disclosed above. Subsequent to a high temperature cure, the ULK film was exposed to HMDS for passivation to make the film more hydrophobic and to improve adhesion of the film to the next layer above it in a multilayer device. The K values of the ULK films were measured. Subsequently, on each wafer, a 500 Å high-K film containing prehydrolyzed TEOS as the binder was spun onto the ULK film, and another HMDS passivation process was performed. The K value was again measured. Subsequently, an oxide cap of approximately 1,400 Å was deposited on top of the enriched film.

Stud pull tests were performed on 15 pieces broken from each wafer. The studs were bonded to the oxide cap with epoxy. The films did not exhibit adhesion failure until a pull force of 11 kPSI was reached. The separation generally occurred between the epoxy and the stud itself. Except for the film with lowest concentration of OPD-POSS, most of the studs broke off, leaving the epoxy on the films. In a few cases the epoxy came off with studs, but the oxide cap remained intact This was demonstrated under the microscope and by measuring the area depth with a KLA-Tencor P10 profilometer. For the film with lowest concentration of OPD-POSS, 50% of the studs came off with epoxy and 50% of the studs came off with the film (i.e., in this case there was no film left on the wafer). Also, the standard deviation of the stud pull results was higher (2.55) in this case compared to the films having a higher OPD-POSS concentration (e.g., 0.88), showing non-uniformity in the film with the lowest OPD-POSS concentration.

The results are summarized in Table 3. As indicated, the adhesive strength increased with increasing binder concentration. The film with the mixed OPD-POSS/TDS-POSS binder showed good adhesion, but there was no significant improvement compared to the two other films containing the higher concentrations of the OPD-POSS binder. An initial tape test showed that even the film with lowest concentration of the binder passed the test.

Subsequently, the four wafers were tested for thermal stability by annealing the wafers at 400° C. for 6 hours. Scribed tape tests were performed on the wafers after each hour. All four wafers passed all of the tape tests.

The adhesion characteristics and modulus/hardness of prehydrolyzed TEOS binders "POSS" binders were compared. Table 4 in FIG. 6 summarizes the results of the comparison.

To test the adhesion characteristics of the low-K layer to an underlying SiN layer, a SiN layer 1,230 Å thick was deposited on three silicon wafers by CVD. On two of the wafers an ULK layer with an OPD-POSS binder was deposited, and on the third wafer an ULK layer with a TDS-POSS binder was deposited. The final stack was SiN/ ULK "POSS" silicalite/enriched prehydrolyzed TEOS-plus-silicalite/oxide cap)

As evident from the results summarized in Table 5 in FIG. 7, the ULK films possess very favorable bottom layer adhesion to SiN. The bottom layer adhesion as shown by the stud pull test exhibited a stud pull strength measurement of more than 11 kPSI.

As described above, depositing a thin high-K film on top of a low-K film increases the adhesion strength without significantly increasing the overall capacitance of the two films. A thin high-K film (e.g., approximately 400–500 Å thick) provides extremely good adhesion characteristics.

It is believed that the improved adhesion characteristics of these films are due to the high concentration of binder in the enriched precursor, which equates to lower porosity and greater contact between the high-K film and the overlying CVD dielectric layer. The working hypothesis is that the adhesion between a low-K film and an overlying CVD dielectric layer may be due to the rough surface of the low-K film. Low-K films typically have a surface roughness approximately equal to half the size of the average particle diameter.

The experiments described above have been employed to improve the adhesion of CVD cap layers deposited onto silicalite films. In each of these experiments, adhesion of the silicalite to the underlying surface has been acceptable. However, it is conceivable that silicalite could one day be deposited onto a film to which it adheres poorly. In such a case, it is reasonable to assume that a binder-enriched layer deposited first, with the low-K film above it, would be as effective as the results described here. In such a process the binder-enriched layer and the low dielectric layer could be baked, cured and passivated as described above. Moreover, in some situations a three-layer structure might be advantageous, consisting of a first binder-enriched layer, a low dielectric layer on the first binder-enriched layer, and a second binder-enriched layer on the low dielectric layer. This would improve the adhesion of the silicalite-plus-binder film to both the underlying and overlying films.

Further optimization in the composition and processing of the enriched binder layer is envisioned to further minimize the thickness of the high-K film while maintaining sufficient adhesive strength to leave the total film stack compatible with IC processing. Minimizing the thickness of the high-K film minimizes the impact of the high-K film on the total capacitance of the stack.

This invention may be provided in other specific forms and embodiments without departing from the essential characteristics as described herein. The embodiments described above are to be considered in all aspects as illustrative only and not restrictive in any manner. The following claims rather than the foregoing description indicate the scope of the invention.

We claim:

1. A method of enhancing adhesion to a low-dielectric constant layer, said low-dielectric constant layer being formed by delivering a first precursor onto a substrate, the first precursor comprising a binder in an organosol comprising silicalite particles, the concentration of binder in the organosol being equal to a first concentration, said method comprising:

delivering a second precursor onto the low dielectric constant layer to form a binder-enriched layer, the second precursor comprising a binder in an organosol comprising silicalite particles, the concentration of binder in the organosol in the second precursor being equal to a second concentration, the second concentration being greater than the first concentration; and baking and curing the low dielectric constant and binder-enriched layers.

2. The method of claim 1 wherein the binder in the first precursor comprises a material selected from the group consisting of prehydrolyzed tetraethyl orthosilicate (TEOS), derivatives of polyhedral oligomeric silsesquioxanes (POSS), tetramethoxysilane (TMOS), methylsilsesquioxane, hydridosilsesquioxane, and organic polymers.

3. The method of claim 2 wherein the binder in the first precursor comprises prehydrolyzed TEOS.

4. The method of claim 2 wherein the binder in the first precursor comprises approximately 27% prehydrolyzed TEOS in ethanol.

5. The method of claim 2 wherein the binder in the second precursor comprises prehydrolyzed TEOS.

6. The method of claim 2 wherein the binder in the first precursor comprises octapolydimethlysiloxane-POSS (OPD-POSS).

7. The method of claim 6 wherein the binder in the second precursor comprises prehydrolyzed TEOS.

8. The method of claim 2 wherein the binder in the first precursor comprises trisdimethylsilcane cyclopentyl-POSS (TDS-POSS).

9. The method of claim 8 wherein the binder in the first precursor comprises a mixture of OPD-POSS and TDS-POSS.

10. The method of claim 9 wherein the binder in the second precursor comprises prehydrolyzed TEOS.

11. The method of claim 1 wherein the second concentration is approximately 2 to 20 times greater than the first concentration.

12. The method of claim 1 wherein the low dielectric constant layer has a K less than or equal to 2.2.

13. The method of claim 1 wherein the low dielectric constant layer and binder-enriched layer together have a K in the range of 2.2 to 2.64.

14. The method of claim 1 comprising baking the low dielectric layer before delivering the second precursor.

15. The method of claim 1 comprising curing the low dielectric layer before delivering the second precursor.

16. The method of claim 1 comprising passivating the low dielectric layer before delivering the second precursor.

17. The method of claim 1 wherein delivering a first precursor comprises spin-coating.

18. The method of claim 1 wherein delivering a second precursor comprises spin-coating.

19. A method of enhancing the adhesion of a silicalite-plus-binder film to a substrate comprising:
   delivering a first precursor onto a substrate to form a binder-enriched layer, the first precursor comprising a binder in an organosol comprising silicalite particles, the concentration of binder in the organosol in the first precursor being equal to a first concentration;
   delivering a second precursor onto the binder-enriched layer to form a low dielectric constant layer, the second precursor comprising a binder in an organosol comprising silicalite particles, the concentration of binder in the organosol in the second precursor being equal to a second concentration; the second concentration being less than the first concentration.

20. The method of claim 19 wherein the binder in the second precursor comprises a material selected from the group consisting of prehydrolyzed tetraethyl orthosilicate (TEOS), derivatives of polyhedral oligomeric silsesquioxanes (POSS), tetramethoxysilane (TMOS), methylsilsesquioxane, hydridosilsesquioxane, and organic polymers.

21. The method of claim 20 wherein the binder in the second precursor comprises prehydrolyzed TEOS.

22. The method of claim 20 wherein the binder in the second precursor comprises approximately 27% prehydrolyzed TEOS in ethanol.

23. The method of claim 20 wherein the binder in the first precursor comprises prehydrolyzed TEOS.

24. The method of claim 20 wherein the binder in the second precursor comprises octapolydimethlysiloxane-POSS (OPD-POSS).

25. The method of claim 24 wherein the binder in the first precursor comprises prehydrolyzed TEOS.

26. The method of claim 20 wherein the binder in the second precursor comprises trisdimethylsilcane cyclopentyl-POSS (TDS-POSS).

27. The method of claim 26 wherein the binder in the second precursor comprises a mixture of OPD-POSS and TDS-POSS.

28. The method of claim 27 wherein the binder in the first precursor comprises prehydrolyzed TEOS.

29. The method of claim 19 wherein the first concentration is approximately 2 to 20 times greater than the second concentration.

30. The method of claim 19 wherein the low dielectric constant layer has a K less than or equal to 2.2.

31. The method of claim 19 wherein the low dielectric constant layer and binder-enriched layer together have a K in the range of 2.2 to 2.64.

32. The method of claim 19 comprising baking the binder-enriched layer before delivering the second precursor.

33. The method of claim 19 comprising curing the binder-enriched layer before delivering the second precursor.

34. The method of claim 19 comprising passivating the binder-enriched layer before delivering the second precursor.

35. The method of claim 19 wherein delivering a first precursor comprises spin-coating.

36. The method of claim 19 wherein delivering a second precursor comprises spin-coating.

37. A method of enhancing the adhesion of a silicalite-plus-binder film to a substrate, and enhancing the adhesion of films deposited onto the silicate-plus-binder layer comprising:
   delivering a first precursor onto a substrate to form a first binder-enriched layer, the precursor comprising a binder in an organosol comprising silicalite particles, the concentration of binder in the organosol in the first precursor being equal to a first concentration,
   delivering a second precursor onto the binder-enriched layer to form a low dielectric constant layer, the second precursor comprising a binder in an organosol comprising silicalite particles, the concentration of binder in the organosol in the second precursor being equal to a second concentration; the second concentration being less than the first concentration,
   delivering a third precursor onto the low dielectric constant layer to form a second binder-enriched layer, the third precursor comprising a binder in an organosol comprising silicalite particles, the concentration of binder in the organosol in the third precursor being equal to a third concentration; the third concentration being greater than the second concentration.

38. The method of claim 37 in which the third concentration is equal to the first concentration.

39. The method of claim 37 in which the third concentration is less than the first concentration.

40. The method of claim 37 in which the third concentration is greater than the first concentration.

41. The method of claim 37 in which the first and third precursors are deposited from a single container.

* * * * *